United States Patent [19]
Yang et al.

[11] Patent Number: 5,470,611
[45] Date of Patent: Nov. 28, 1995

[54] METHOD FOR FORMING AN OXIDE FILM OF A SEMICONDUCTOR

[75] Inventors: Chang-jip Yang; Jun-gyo Jung, both of Suwon, Rep. of Korea

[73] Assignee: Samsung Electronics Co., Ltd., Suwon, Rep. of Korea

[21] Appl. No.: 338,816

[22] Filed: Nov. 10, 1994

Related U.S. Application Data

[63] Continuation of Ser. No. 134,847, Oct. 12, 1993, abandoned.

[30] Foreign Application Priority Data

Oct. 12, 1992 [KR] Rep. of Korea ............... 92-18695

[51] Int. Cl.$^6$ ................................................. C23C 16/40
[52] U.S. Cl. ..................... 427/255.4; 427/248.1; 427/255; 427/255.7; 427/397.7; 427/419.3; 437/239; 437/941; 437/952
[58] Field of Search ............... 427/248.1, 255.4, 427/255.1, 255.2, 255.7, 255, 397.7, 419.3; 437/941, 952, 239

[56] References Cited

U.S. PATENT DOCUMENTS 5,183,783 2/1993 Ohta et al. .................... 437/225

OTHER PUBLICATIONS

Wolf et al, "Silicon Processing For The VLSI ERA, vol. 1: Process Technology", Lattice Press (1986) pp. 182–184 and 198–201.

Niwa et al, "$SiO_2$/Si Interfaces Studied by Scanning Tunneling Microscopy and high Resolution Transmission Electron Microscopy" J. Electrochem. Soc., vol. 139, No. 3, Mar. 1992, pp. 901–906.

Primary Examiner—Roy V. King
Attorney, Agent, or Firm—Charles R. Donohoe; Stephen R. Whitt

[57] ABSTRACT

In a method for forming a compound oxide film such as a gate oxide film of a MOS device, after a first oxide film (such as a HTO film) is formed on a semiconductor substrate by deposition at a high temperature, a second oxide film is formed below the first oxide film by wet oxidizing the surface of the semiconductor substrate, which results in a compound oxide film consisting of the HTO film and the wet oxide film. Therefore, a high quality oxide film having excellent electrical characteristics can be formed.

4 Claims, 6 Drawing Sheets

METHOD FOR FORMING AN OXIDE FILM OF A SEMICONDUCTOR

This is a continuation of application Ser. No. 08/134,847 filed on Oct. 12, 1993, now abandoned.

Background of the Invention

The present invention relates to a method for forming an oxide film of semiconductor device, and more particularly, to a method for forming an advantageously thin oxide film, such as a gate oxide film of a MOS device.

As the integration density of semiconductor devices advances, the thickness of oxide films used therein must become thinner. However, operational voltages applied to the oxide film do not decrease in proportion to the required thinning. Accordingly, since thin oxide films are sensitive even to micro defects, a reliable oxide film is needed.

There are various kinds of thin oxide films for MOS devices. They can be classified as dry and wet oxide film. Dry oxide films are, for example, formed under an atmosphere of $O_2$ or $O_2+HCl$, but typically have defects such as micropores or voids inside the oxide film.

Wet oxide films, having low mechanical stress and excellent electrical characteristics, are therefore typically used. However, if the wet oxide film is used as a gate oxide film of a MOS device, the volume of Si—P bonds increases from the interaction between the Si atoms of polysilicon and the $P^-$ ions of $POCl_3$ when $POCl_3$ is introduced to dope the polysilicon gate electrode material. As a result, the interface of oxide film and polysilicon are stressed, and $P^-$ from the gate electrode dopant and Si atoms of the oxide film react with each other as the combining force of the oxide film of the lower part of polysilicon weakens. Si atoms of the oxide film are thereby consumed at the interfaces of the oxide film and polysilicon, which degrade the breakdown characteristics of the oxide film.

In addition to this, conventional dry and wet oxide films have no tolerance for and are degraded by micro pits in the surface of a bare silicon wafer. Therefore, device yield is reduced due to deterioration in the reliability of the oxide film itself when the dry or wet oxide films are applied as a capacitor oxide film or as a gate oxide film of a MOS device.

Further, a high temperature oxide (HTO) film can be grown by a deposition process independent of the surface conditions of a silicon wafer, differently from the dry or wet oxide film, and is used widely as an oxide film that is not affected by the condition of the silicon substrate. However, after stress is applied to the HTO film, a dielectric breakdown characteristic, (especially, a time-dependent dielectric breakdown (TDDB) characteristic), and current-to-voltage characteristics are degraded.

SUMMARY OF THE INVENTION

Accordingly, it is an object of the present invention to provide a method for forming a high quality oxide film which overcomes the defects and operational difficulties of conventional dry and wet oxide films as described above, to thereby improve the reliability of a semiconductor device.

To accomplish the above object, the present invention provides a method for forming a compound oxide film which comprises the steps of forming a first oxide film on a semiconductor substrate by a low-pressure chemical vapor deposition (LPCVD) method at a high temperature, and then forming a second oxide film below the first oxide film by wet oxidizing the surface of the semiconductor substrate, to obtain a compound oxide film of a semiconductor device.

The first oxide film, e.g., HTO film), is formed to a thickness of about 50–200 Å using a LPCVD method, for example, using a $SiH_4+N_2O$ gas system as a source under a pressure of about 0.5 Torr and a temperature between about 700° C. to 850° C.

The second oxide film, (i.e., a wet oxide film), has a thickness between about 50–200 Å and is formed at a temperature of about 800° C. to 900° C. in a pyrogenic system which uses a general quartz tube.

As described above, the present invention forms a compound oxide film by combining a first oxide film which provides uniform film quality (which is an advantage of HTO film), oxide film growth without regard to the cleaning status prior to growing the oxide film, and a high tolerance for minute pits in the surface of a silicon substrate; and a second oxide which has a characteristic of low stress in the oxide film (which is an advantage of wet oxide film) and excellent electrical properties to thereby improve the overall film quality of the compound oxide film and ensure device reliability when applied to MOS devices.

BRIEF DESCRIPTION OF THE DRAWINGS

The above objects and other advantages of the present invention will become more apparent by describing in detail a preferred embodiment thereof with reference to the attached drawings in which.

DETAILED DESCRIPTION OF THE INVENTION

The present invention will be described below in more detail with reference to the attached drawings.

To explain the effect of the present invention clearly, methods of forming a conventional thermal oxide film and a high temperature oxide (HTO) film and their characteristics are presented as examples to be compared with the method of forming an oxide film and the characteristics thereof, according to the embodiment of the present invention.

EXAMPLE 1

A compound oxide film was formed for Example 1 according to the present invention. A method manufacturing the compound film will be described herebelow with reference to FIGS. 4 and 5.

Figure 4:
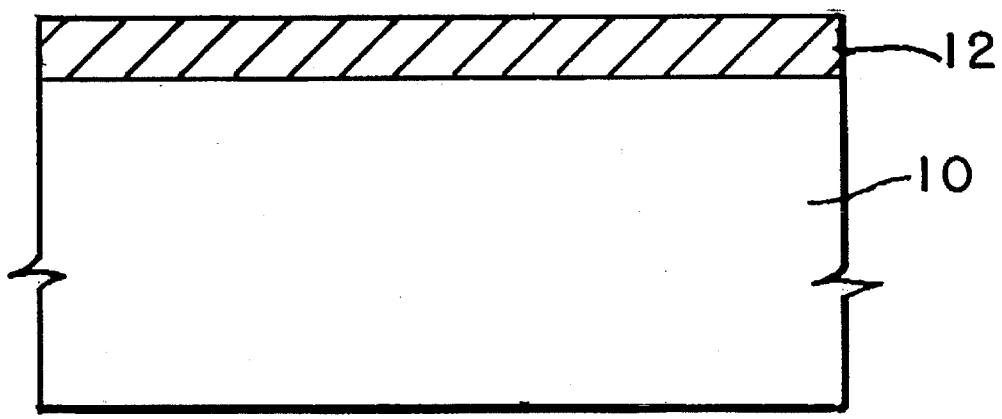
FIGS. 4 and 5 are sectional views illustrate a method for forming a compound oxide film according the present invention.
Figure 5:
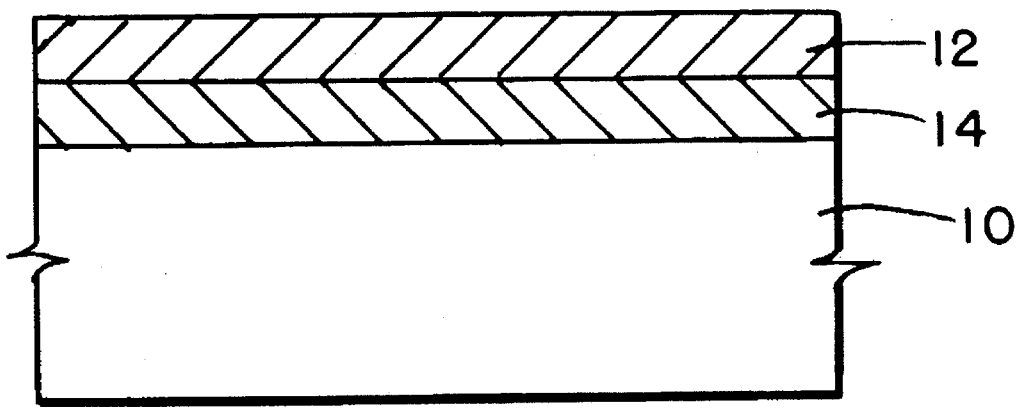

Referring to FIG. 4, an HTO film was formed on a semiconductor substrate 10 as a first oxide film 12 with a thickness of 100 Å, in a general LPCVD tube by using a SiH$_4$+N$_2$O gas system as a source, the pressure being 0.5 Torr, and the temperature being between about 700° C. and about 850° C. Then, referring to FIG. 5, wet oxidation was performed in a pyrogenic system using a general quartz tube at a temperature of about 800°–900° C. so that the surface of the semiconductor substrate 10 was oxidized to thereby form a second oxide film 14 below the first oxide film 12, (i,e., the HTO film), with a thickness of 100 Å. During the wet oxidation, oxygen gas O$_2$ diffuses through the first oxide film 12 to reach an upper portion of the substrate 10, whereupon the oxygen gas reacts with the silicon of the substrate 10 to form the second oxide film 14.

Comparative Example 1

A dry thermal oxide film was formed to a thickness of 200 Å, in a general quartz tube at a temperature of 950° C. and by dry oxidation under a 1% atmosphere of O$_2$+HCl.

Comparative Example 2

An HTO film was formed to a thickness of 200 Å under the same conditions as that of the above "Example 1."

Figures 1A, 1B:
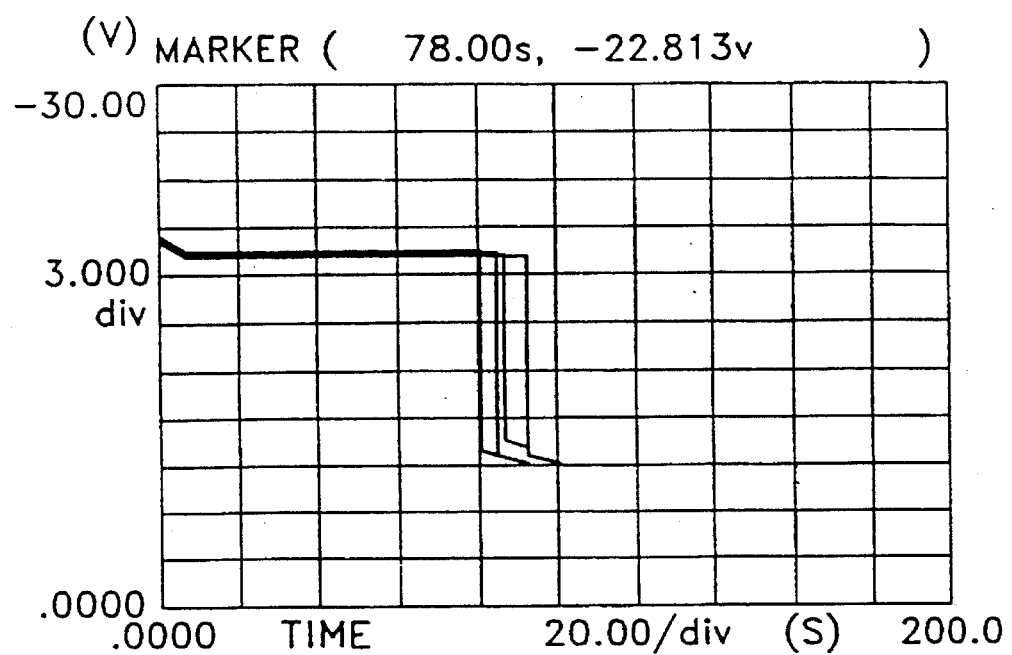
FIGS. 1A, 1B and 1C are graphical representations showing the TDDB characteristics of the oxide films of two conventional methods and that of the present invention, respectively.
Figure 1C:
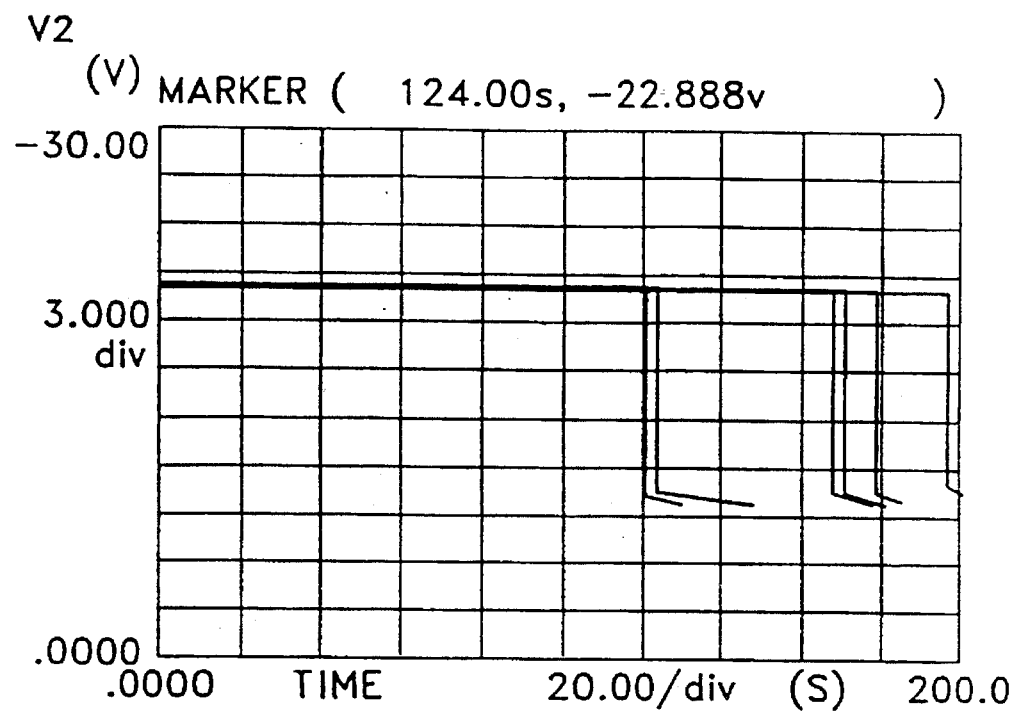

FIGS. 1A, 1B and 1C are graphical representations showing the evaluated TDDB characteristics of oxide films at normal temperatures, formed by the Comparative Examples 1 and 2, and Example 1. Here, FIG. 1A shows the TDDB characteristic of the dry oxide film of Comparative Example 1, FIG. 1B shows the TDDB characteristic of the HTO film of Comparative Example 2, and FIG. 1C shows the TDDB characteristics of the combined HTO film and wet oxide film of Example 1.

As shown in FIGS. 1A–1C, the TDDB characteristics of the oxide film of Example 1, which is formed by combining the HTO film and wet oxide film according to the present invention, are better than that of the conventional dry oxide film and HTO film.

Figure 2A:
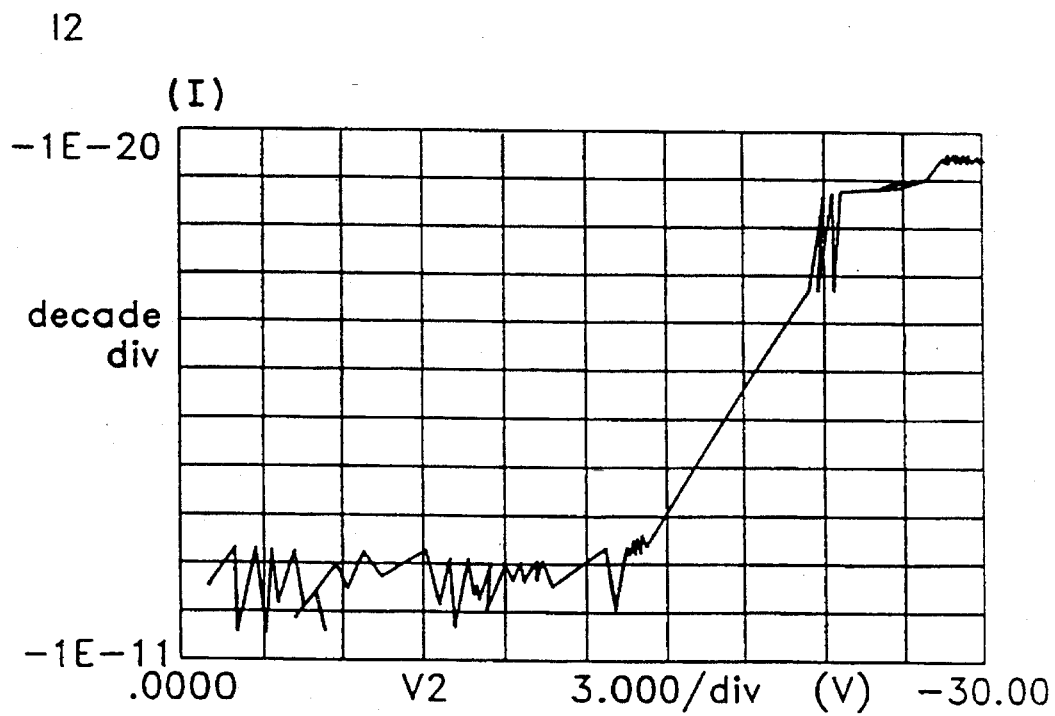
FIGS. 2A, 2B and 2C are graphical representations showing the current-to-voltage characteristics of the oxide films of two conventional methods and that of the present invention, respectively.
Figure 2B:
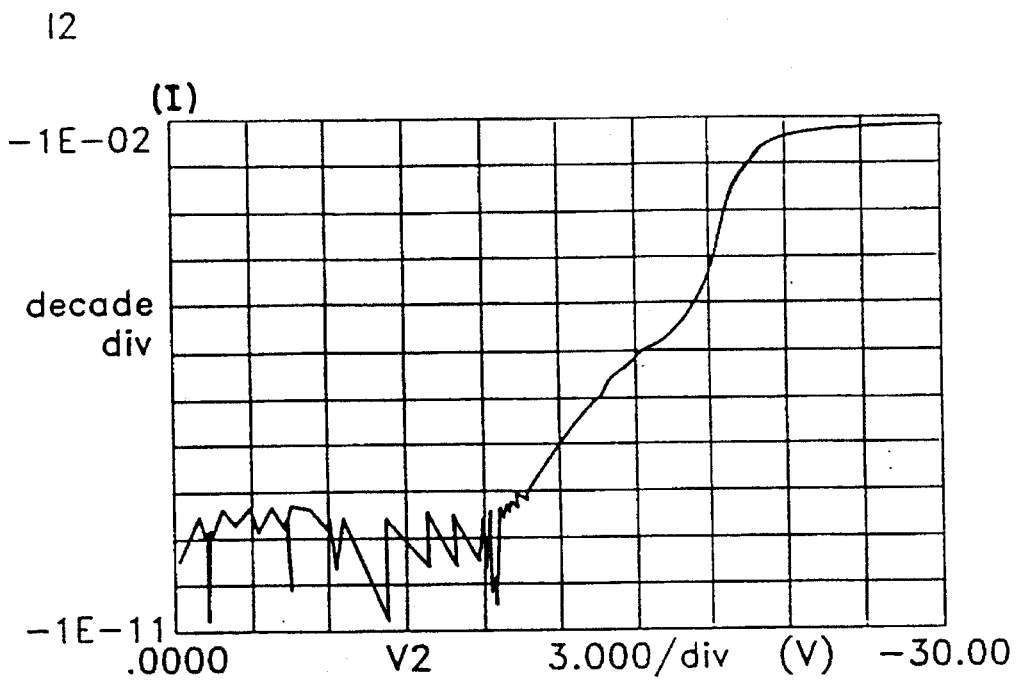
Figure 2C:
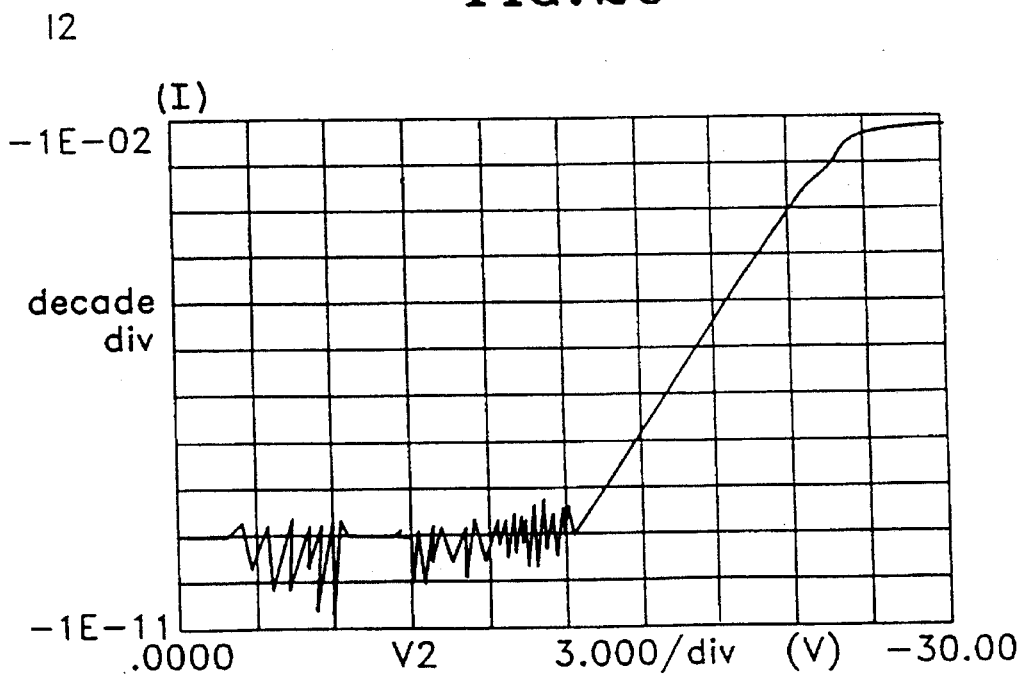

FIGS. 2A, 2B and 2C are graphical representations showing the current-to-voltage (I–V) characteristics of oxide films formed in Comparative Examples 1 and 2, and in Example 1. Here, FIG. 2A shows the I–V characteristics of the dry oxide film of Comparative Example 1, FIG. 2B shows the I–V characteristics of the HTO film of Comparative Example 2, and FIG. 2C shows the I–V characteristics of the combined HTO film and wet oxide film of Example 1. An HP4145B (manufactured by Hewlett-Packard) was used to measure the I–V characteristics, where the current was 10 µA, the chuck temperature was 100° C., and the measured area was 0.004 cm$^2$ in size, by increasing the ramp step by 3 V steps in the sweep mode.

As shown in FIG. 2A–FIG 2C, the HTO film combined with wet oxide film in Example 1 according to the present invention has a better current-to-voltage characteristic whereupon the oxide film breaks down, as compared with the conventional dry oxide film and HTO film.

Figure 3A:
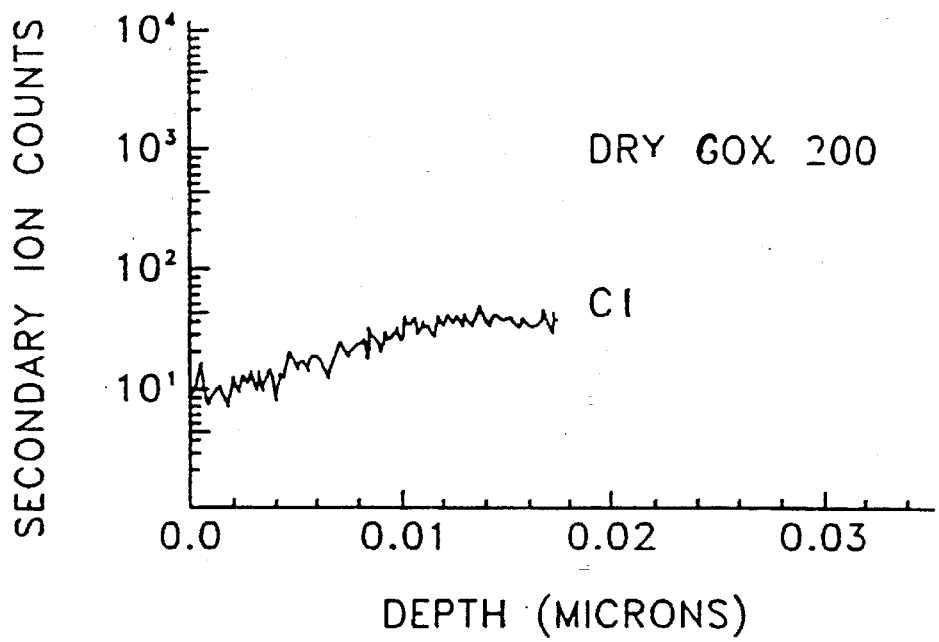
FIGS. 3A, 3B and 3C are secondary ion mass spectroscopy (SIMS) analytic views of the oxide films of two conventional methods and that the present invention, respectively.
Figure 3B:
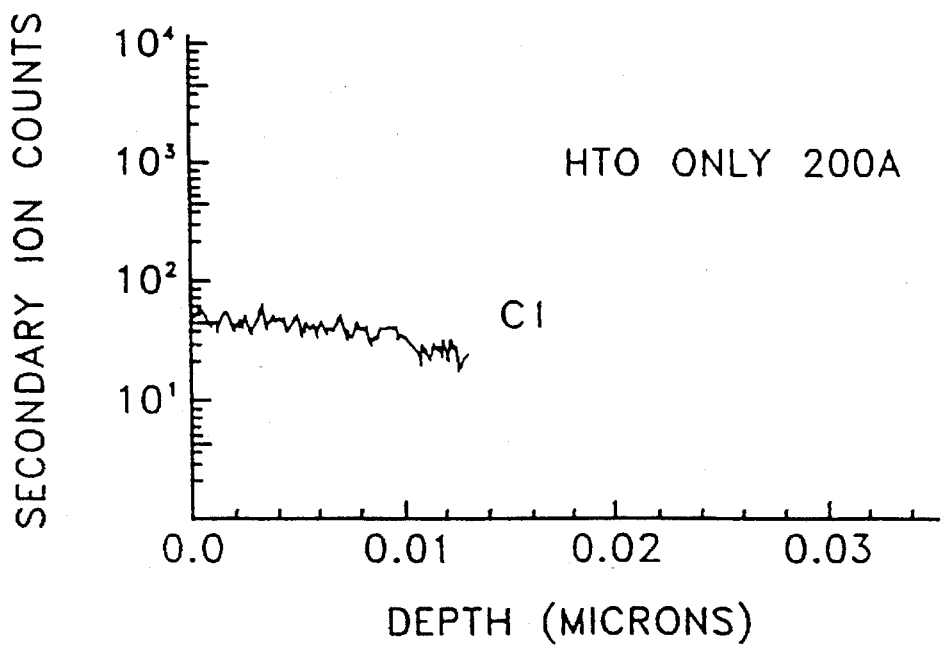
Figure 3C:
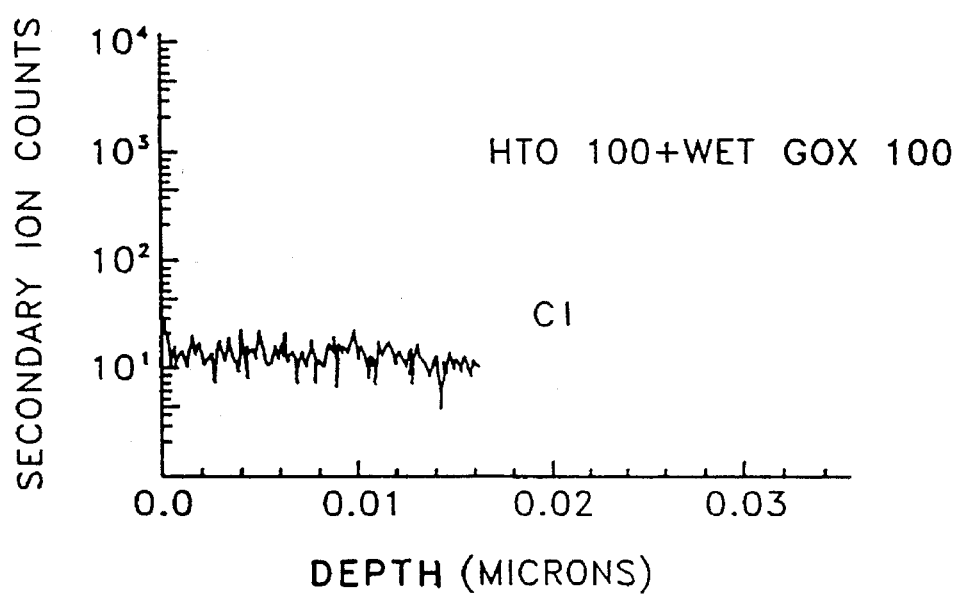

FIGS. 3A, 3B and 3C show the results of a SIMS analysis of the oxide films formed by Comparative Examples 1 and 2, and Example 1, respectively. Referring to the dry oxide film of Comparative Example 1 in FIG. 3A, the distribution of Cl$^-$ ions increases as the point of measurement moves away from the interior of the oxide film and approaches the boundary between the oxide film and the silicon substrate. For the HTO film of Comparative Example 2 shown in FIG. 3B, the distribution of Cl$^-$ ions in the oxide film also decreases as the point of measurement approaches the boundary between oxide film and silicon substrate. However, for the oxide film according to the embodiment of the present invention in Example 1, illustrated in FIG. 3C, the distribution of Cl$^-$ ions is substantially constant throughout the oxide film.

As can be seen from the above, the best quality oxide film is formed by growing an HTO film whose thickness is approximately 100 Å as a first oxide film, and then growing a wet oxide film, whose thickness is approximately 100 Å, below the first oxide film as a second oxide film. This combines advantageous characteristics of HTO film with advantageous characteristics of wet oxide film, as noted above.

As shown in the following Table 1, the TDDB characteristics of the conventional dry oxide film and HTO film are respectively compared with the case of the thin oxide film of a MOS device being made of an HTO film and wet oxide film. (Here, measurements are made with an HP4145B over an area of 0.004 cm$^2$ and with a current of 10 µA and normal temperatures.)

TABLE 1

| oxide film type | TDDB (in seconds) |
| --- | --- |
| dry oxide film (200Å) | 84 |
| HTO film (200Å) | 57 |
| HTO (100Å) + wet oxide film (100Å) | 166 |

As shown in Table 1, when the oxide film of the present invention, which consists of the high temperature oxide film and the wet oxide film is used as a thin oxide film of a MOS device, better TDDB characteristics than the conventional dry oxide film and HTO film are realized.

Thus, an oxide film which has high quality with excellent electrical characteristics can be formed according to the present invention to thereby improve semiconductor device reliability.

It should be understood although preferred embodiments of the invention have been described in detail above, many modifications and variations could be effected therein by one with ordinary skill in the art without departing from the spirit and scope of the invention as defined by the appended claims.

What is claimed is:

1. A method for manufacturing a compound oxide film of a semiconductor device, comprising the steps of:

(a) forming a first oxide film on a semiconductor substrate using a low pressure chemical vapor deposition; and (b) forming a second oxide film to a thickness between about 50 Å and about 200 Å between said substrate and said first oxide film using a wet oxidation process.

2. The method for manufacturing a compound oxide film according to claim 1, wherein said low-pressure chemical vapor deposition process is performed at a temperature between about 700° C. and about 850° C.

3. The method for manufacturing a compound oxide film according to claim 1, wherein said step of forming said first oxide films forms said first oxide film to a thickness between about 50 Å to about 200Å.

4. The method for manufacturing a compound oxide film according to claim 1, wherein said step of forming said second oxide film is performed using a pyrogenic system at a temperature between about 800° C. and about 900° C.

* * * * *